United States Patent [19]
Nygaard, Jr.

[11] Patent Number: 6,052,807
[45] Date of Patent: *Apr. 18, 2000

[54] MULTIPLE PROBE TEST EQUIPMENT WITH CHANNEL IDENTIFICATION

[75] Inventor: Richard A. Nygaard, Jr., Colorado Springs, Colo.

[73] Assignee: Hewlett-Packard Company, Palo Alto, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/996,979

[22] Filed: Dec. 23, 1997

[51] Int. Cl.$^7$ ..................................................... G01R 31/28
[52] U.S. Cl. ............................................ 714/724; 324/754
[58] Field of Search ................................... 371/22.1, 20.4, 371/22.36, 27.1, 27.2, 28; 364/481, 483, 550; 324/500, 751, 757, 759, 765; 714/724, 726, 735, 742, 721, 719, 43, 45, 56

[56] References Cited

U.S. PATENT DOCUMENTS

| | | | |
|---|---|---|---|
| 5,440,227 | 8/1995 | Rogers | 324/72.5 |
| 5,446,650 | 8/1995 | Overhage et al. | 364/487 |
| 5,495,282 | 2/1996 | Mostafa et al. | 348/5 |
| 5,600,236 | 2/1997 | Haley et al. | 324/158.1 |
| 5,659,255 | 8/1997 | Strid et al. | 324/754 |
| 5,703,928 | 12/1997 | Galloway et al. | 379/21 |

*Primary Examiner*—Robert W. Beausoliel, Jr.
*Assistant Examiner*—Nadeem Iqbal
*Attorney, Agent, or Firm*—Edward L. Miller

[57] ABSTRACT

Multi-channel measurement equipment identifies probe-to-channel correspondence by providing an identification (ID) terminal that can be touched by a probe whose channel correspondence is sought. A ID signal identifiable by its uncommon properties is present at the ID terminal. The uncommon ID signal is generated by a suitable circuit, which may be similar to pseudo random sequence generator. Each channel is equipped with a recognition circuit that recognizes the presence of the uncommon ID signal. The recognition circuits each receive a copy of the uncommon ID signal, and the task of recognition is performed by pattern matching over time. To discover a probe's channel identity the operator touches the probe to the ID terminal. After a suitable but brief period of time the recognition circuit for that probe produces an output that indicates recognition. The measurement equipment may display a message on a screen to the effect that the system has noticed that the probe for channel "X" is on the ID terminal.

8 Claims, 8 Drawing Sheets

MULTIPLE PROBE TEST EQUIPMENT WITH CHANNEL IDENTIFICATION

BACKGROUND OF THE INVENTION

Certain types of test equipment, such as logic analyzers and timing analyzers, have a large number of input data channels. Each data channel has a probe associated therewith. Some probes are a complete apparatus in themselves, perhaps including attenuators and active electronics. Others are nothing more than a simple length of wire extending from a probe pod and having an individual push-on connector at a distal end for connection to a signal of interest; the probe pod contains any needed signal conditioning and threshold detection circuitry. In certain cases where the data to be probed occurs within a well defined environment, such as bus, what can extend from the probe pod is a suitable multi-conductor cable having a standard multi-pin connector mounted at its distal end.

In a case where probing is accomplished by attaching a standard multi-pin connector there is little or no chance for an error concerning the correspondence between particular data signals in the environment under test and the particular channels available on the test equipment; it is literally hardwired. However, the case where an operator has to manually place a large number of individual probes (which we may term the "do it yourself case") is sometimes the occasion for confusion and/or error. The sheer number of connections to be made, in conjunction with tight quarters and tiny printing (not to mention last minute changes in ones plans) afford ample occasion for confusion, which may or may not also be accompanied by error.

In any event, the operator generally has a pretty good idea of which channel should go where in the environment be measured. So, when holding a probe yet to be attached, or when holding a probe that has fallen off and needs to be re-attached, the first question likely to come to mind is "What channel is this?" Some oscilloscopes have approached this problem by placing a channel ID push button in a place easily associated with the probe. The activation of the ID button shifts or intensifies that portion of the display that is for the associated channel. The location of the ID button could be on the front panel of the scope itself, which works as long as the number of probe cables is small enough that the eye can follow a cable from one end to the other (which is to say that probe-to-channel correspondence is not a difficult issue, anyway). The location of the ID button could be on the probe body, but that is a real complication in a system with thirty-two (or more!) probes. (There are cost and reliability issues surrounding the extra conductors and their connections, as well as the ugliness of the added physical size needed to support a switch.) All in all, the real value of such an ID button is in an oscilloscope setting of say, eight channels or less, where each channel is independently positionable on the screen. That is, at this moment the D channel might be at the top of the screen, whereas ten minutes ago the A channel was on top. The operator eventually forgets which state of affairs is presently the case, and resorts to the channel ID buttons to learn the order in which the channels are positioned on the screen. Probe-to-signal correspondence is generally not the issue, since the operator can usually see what it is simply by looking, because the number of channels is small. If the number of channels were large, then an ID button would have to be on the probe to be effective, but the associated design issues are unpleasant to contemplate.

While state analyzers and timing analyzers do not generally have (fine) vertical position controls for individual channels, they do usually allow the user to specify which trace represents which channel (an ordering of the channels, which amounts to a coarse position control), so the positioning of channels on the screen remains a potential source of mischief. They also often have a large number of channels and associated probes. Probe-to-channel correspondence can thus be a very serious issue, indeed. Individual ID buttons on the probes are even less desirable in this setting, since the probes are often simply short pieces of wire, far smaller than even the most compact attenuator probe for an oscilloscope.

The usual solution for this problem is color coding of the probe wires and labelling on the probe pods. The problem with that solution is that wires coming out of the probe pod are usually replaceable (for various reasons) and in any given instance may not be correctly coded by color according to their location on the probe pod. Even if they are, it is easy to incorrectly parse the colored stripes or bands, and some individuals do not correctly perceive certain colors in the first place. Still other persons have never learned the color code. Labels on the probe pod are useful only when it is possible to follow the wire from one end to the other, a task that can be difficult in a "bird's nest" of wires. Thus, there is a need for certain types of test equipment to be able to assist an operator in answering the question "Which channel is associated with this probe?"

SUMMARY OF THE INVENTION

A solution to the problem of identifying probe-to-channel correspondence is to equip the measurement apparatus (logic or timing analyzer, or whatever) with an identification (ID) terminal located such that it can be readily touched by a probe whose channel correspondence is sought (its channel identity, as it were). A signal identifiable by sufficiently uncommon individual properties (an ID signal) is present at the ID terminal. The uncommon ID signal is generated by a suitable circuit, which may be similar to a pseudo random sequence generator. Each channel is equipped with a recognition circuit that recognizes the presence of the uncommon ID signal. To that end, the recognition circuits each receive a copy of the uncommon ID signal, and the task of recognition is performed by pattern matching over time.

To discover a probe's channel identity the operator touches the probe to the ID terminal. After a brief period of time (say, 100 $\mu$sec to perhaps 100 msec) the recognition circuit for that probe (but no other recognition circuit) produces an output that indicates recognition. Since the recognition circuit producing the output is definitely associated with a particular channel and no others, the desired discovery has, in principle, been accomplished. How to indicate the channel identity to the user is a matter of implementation, and may be as simple as illuminating an annunciator light or displaying a numerical indicator (one or more LED or LCD digits), or it may involve displaying a message on the screen to the effect that the system has noticed that the probe for channel X and with such-and-such a label is on the ID terminal, and indicating other configuration information that has been previously specified, or that exists by default.

A further implication of the channel identity discovery mechanism is an indication that the probe and its associated front-end signal conditioning circuits are probably functional, which is also nice to know.

DESCRIPTION OF A PREFERRED EMBODIMENT

Figure 1:
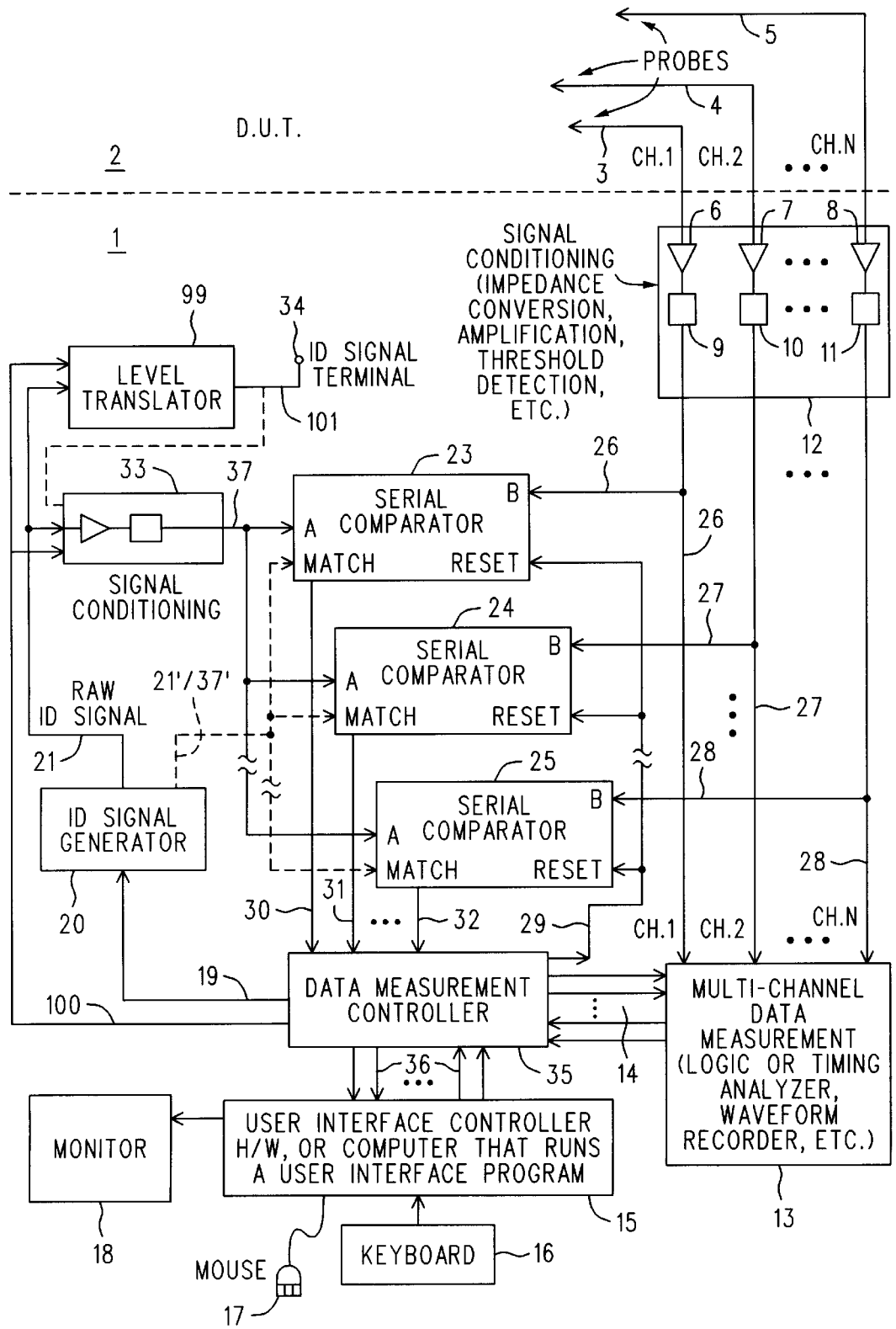
FIG. 1 is a simplified block diagram of a multi-channel data measurement apparatus, such as a logic analyzer, timing analyzer or multi-channel waveform recorder, and having an ID signal generator that drives an ID terminal and a collection of serial comparators respectively coupled to the various channels, thus allowing a probe's channel identification to be determined upon touching that probe to the ID terminal.
Figure 4:
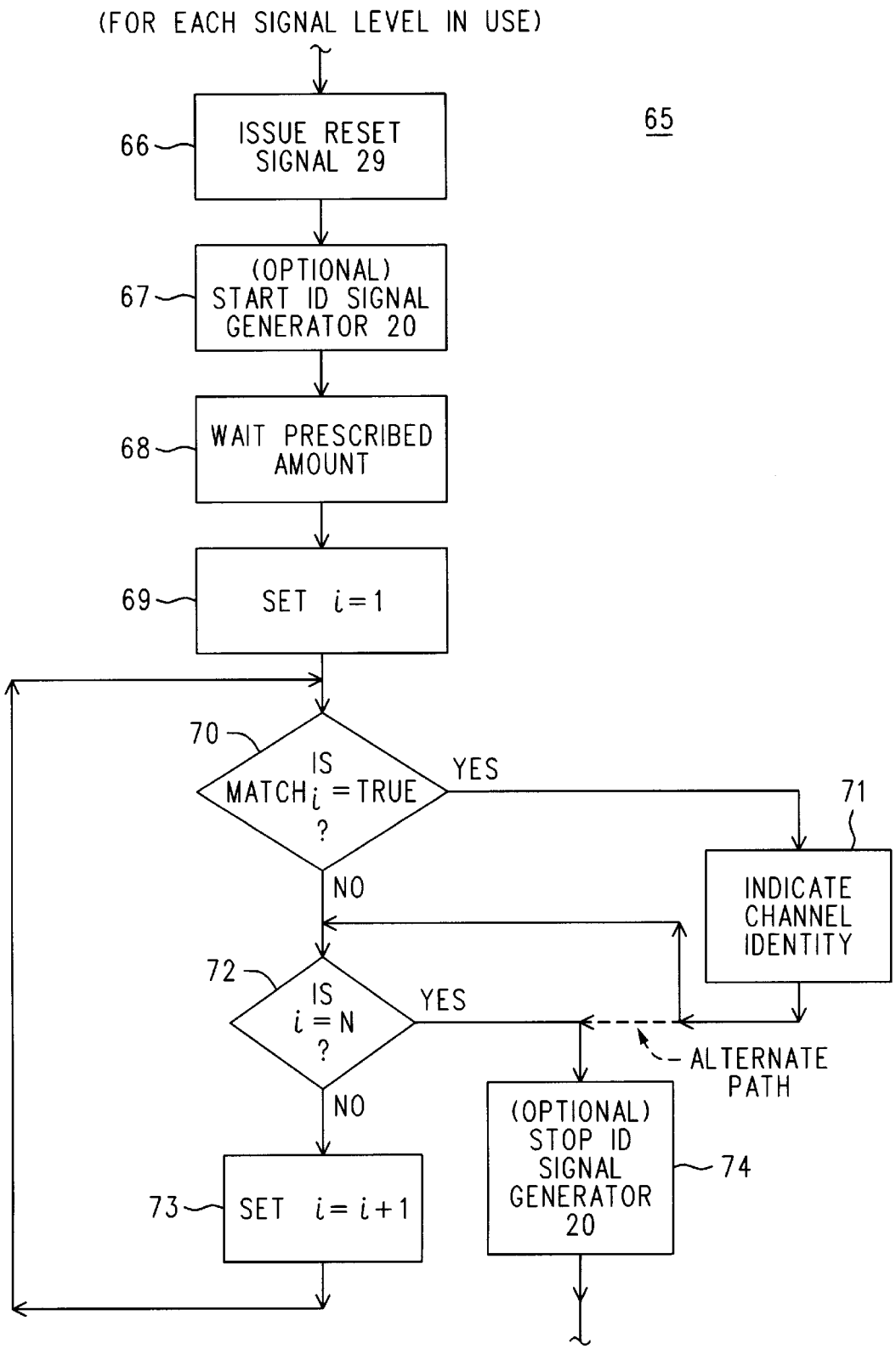
FIG. 4 is a simplified flow chart illustrating the channel ID aspect of a multi-channel data measurement apparatus constructed in the fashion of FIG. 1.
Figure 5:
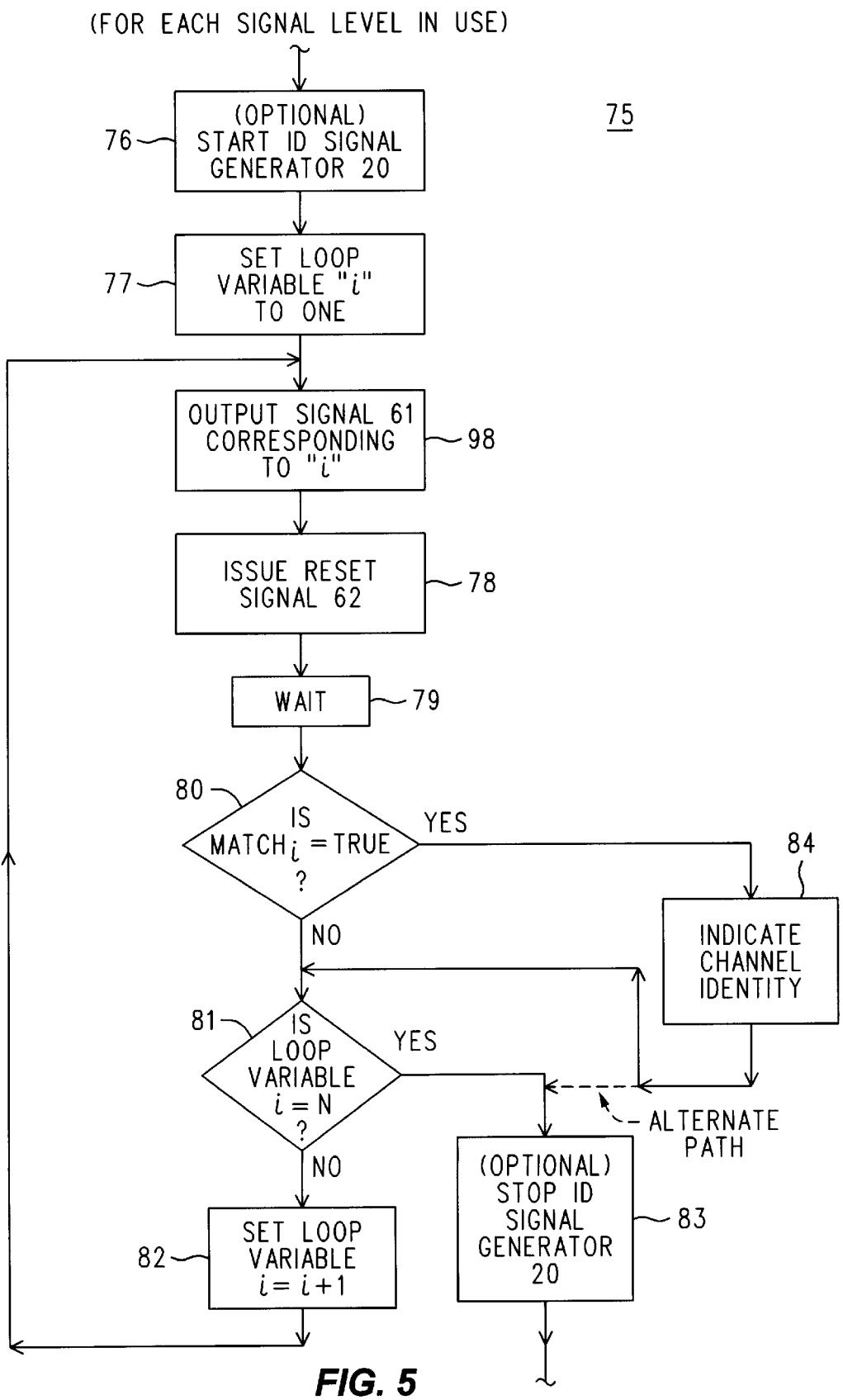
FIG. 5 is a simplified flow chart illustrating the channel ID aspect of a multi-channel data measurement apparatus constructed in the fashion of FIG. 3.

Refer now to FIG. 1, wherein is shown a simplified block diagram of an instance of test equipment 1 having multiple probes (3, 4, and 5) for connection to signals (not shown) in a device under test 2 (D.U.T.). Each probe is associated with a channel. The term "channel" means here what it usually means in a piece of electronic test equipment: one of a plurality of generally identical collections of elements forming a signal processing path among a plurality of such paths. Depending upon the type of measurement to be made by the test equipment 1, a channel may be adjustable with respect to one or more parameters of interest, such as gain, polarity or a threshold. In digital signal environments these parameters are generally associated with differing families of logic. For now, temporarily assume for ease of explanation only, that the logic levels for only a single and known family of logic will be in use. This restriction will be removed at the time FIGS. 4 and 5 are discussed.

We have shown the probes 3–5 as if they were mere electrical connections to conductors. It might be that simple, as in the case where a number of fairly short and flexible color coded wires have either push on connectors (as for a round or rectangular post) or spring-loaded grabbers at their ends. Such leads are sometimes called "flying leads" by certain manufacturers. Sometimes the probes might be nothing more than a twenty-five or thirty-six pin connector at the end of a multi-conductor cable, as when a well defined bus is to be the source of the signals to be measured. We are not particularly interested in that case, as it does not present the problem of discovering or enforcing probe-to-channel correspondence (the channel identity for an individual probe). We shall instead be more concerned with the case where there is a bundle of individual probes, which must be attached one at a time. It will be appreciated that such probes might be simple conductors in the electrical sense ("flying leads"), or passive attenuator probes or even active probes incorporating amplification. The key here is that each channel in use has an associated individual probe that must be individually deployed. It will also be appreciated that in some settings the number of such probes is high, and that they are rather similar in appearance. It is easy to mistake one for another.

The usual case is that the probes 3–5 connect signals to be measured in the D.U.T 2 to some sort of signal conditioning circuitry 12. On a channel by channel basis that circuitry 12 may consist of amplification or impedance conversion (6–8) and/or threshold detection or some other operation (9–11). The resulting conditioned channel signals (26, 27 and 28) are then available for processing by the data measurement apparatus proper.

We have shown that data measurement apparatus proper as a block 13 labelled "MULTICHANNEL DATA MEASUREMENT". It might be a logic state analyzer, a timing analyzer, some other kind of analyzer of multiple signals, or perhaps a waveform recorder for multiple signals.

Before discussing the solution for the channel identity problem, we shall mention that the particular multi-channel data measurement mechanism 13 that we prefer has a separate data measurement controller 35. It also a separate user interface controller 15 which may be a computer that is either a genuine technical workstation or just a personal computer. If it is such a computer, it runs a program that provides a user interface whose output is visible on a monitor 18 (and by extension, on a printer that is not shown) and whose input can include keystrokes from a keyboard 16, pointer movement and button pressings from a mouse 17, as well as stored set-up information in files kept on a mass storage device, such as a disc (not shown). The general idea is that the user uses the keyboard and mouse to respond to menus and enter parameters into fields that define the operational settings ordinarily found on the front panel of a more traditional instrument. The user interface could even be an image of a front panel whose "controls" are then "manipulated". The hardware or computer that is the user interface controller 15 is then interfaced to a data measurement controller 35 (and thus indirectly to the rest of the system) by various signals 36, which may comprise a standard computer interface, such as SCSI, Centronics ("parallel"), the Universal Serial Bus, or, IEEE 488.

The data measurement controller 35 may be a ROM-programmed microprocessor based entity, or it may be a collection of suitable state machines formed from, for example, field programmable gate arrays (FPGA's). The idea here is that there are various hardware resources that need to be configured as to their modes of operation and how they are interconnected. This control is exercised by means various signal, such as 14, 19, 29 and 30–32. Of these, the collection 14 is quite dependent upon the nature of the measurement, a fact easily appreciated by those who have seen this sort of thing in the past. Our interest will lie principally with the other signals. A further idea here is that stuff needed to perform channel identification is to some degree independent from the specific nature of the multi-channel data measurement circuitry 13, which circuitry 13 might even be a module replaceable by another module performing a different type of measurement. As can be seen from the way the figure is drawn, even if that were the case the channel identification stuff would remain exactly, or least mostly, the same.

It will, of course, be understood that it is by no means necessary that the data measurement controller 35 be separate from the data measurement circuitry 13, nor that a separate computer serve as a user interface controller 15. If, for example, the measurement to be made were state acquisition for state analysis, then it would be quite possible to have the monitor, keyboard and controlling programmed algorithms [for both the user interface (15) and measurement control (35)] be integrated with the multi-channel data measurement mechanism (13) into a single piece of (traditional) test equipment (called a logic state analyzer), which could then still have added thereto the channel ID mechanism to be described below.

To continue then, an ID signal generator 20 produces an uncommon raw ID signal 21 (uncommon in the sense that it is extremely unlikely to be identical with any legitimate input signal, and raw in the sense that it might need to be translated to the levels of a different logic family) of a general type that is suitable for measurement by the various data channels via their probes 3–5. That is, if digital signals are what the test equipment 1 measures, then the ID signal generator 20 produces a digital signal 21. If there are level, polarity or frequency constraints imposed by the channels, then the raw ID signal 21 is applied to a level translator 99 whose output 101 conforms to those constraints. The level translator 99 may translate to the level of various logic families, such as ECL, TTL, CMOS, etc., according to the state of one or more control lines 100 that originate with the data measurement controller 35. Thus, translated ID signal 101 is a correctly measurable signal in its own right.

However, if there is more than one family of logic levels in use it may be desirable to build the output driver circuit for the ID terminal 34 such that it simply produces a very large swing of both polarities. Whether or not this is a useful practice in any given application may depend in part upon its compatibility with the probes and their brand of signal conditioning.

The ID signal generator 20 may run continuously, or it may run only in response to the presence of a signal 19. (Say, to reduce unwanted RF radiation that might otherwise contribute to interference or noise in other measurements. In the latter case signal 19 would be produced by the data measurement controller 35 in response to some action by the operator taken within the context of the user interface controller 15.)

The sufficiently uncommon translated ID signal 101 is applied to an ID signal terminal 34, which is preferably on something akin to the front panel of the test equipment 1, or at the least in some location easily accessible by the probes 3–5. Alternatively, each probe pod could carry an instance of an ID signal terminal 34. The uncommon raw ID signal 21 (or the actual translated uncommon ID signal itself) may be put through signal conditioning 33 that matches that done (12) for the data channels, so as to minimize signal skew between a conditioned ID signal 37 and any of the conditioned channel signals 26–28 that may be connected to the ID signal terminal 34. To facilitate this, it may be desirable if the signal conditioning 33 is responsive to the control signals 100 that select the type of level translation. Actual level translation might be performed here, or simply further reconciliation of delays, as needed.

The conditioned ID signal 37 is applied to one input (shown as the "A" input) of each of a plurality of serial comparators (23–25), of which there is one for each channel. (As an alternative, it may be desirable in a digital environment to dispense with the signal conditioning circuit 33 and supply the serial comparators with a "purely logical" signal 21'/37', and then rely on careful clocking inside the serial comparators for immunity to skew.) Each serial comparator also has a "B" input which is coupled to a respective member of the conditioned signals 26–28 that represent the various channels. The serial comparators compare A to B subsequent to a reset signal 29 that also originates with the data measurement controller 35. Each serial comparator produces a match signal 30–32 that starts out TRUE upon a reset, and stays TRUE until set FALSE by a difference between A and B. The match signals 30–32 are applied to the data measurement controller 35, which after a suitable length of time (longer is better, up to a point) determines if any of the match signals is still TRUE. Given the uncommon nature of the translated ID signal 101, that will only happen if the probe (3–5) associated with that match signal has been connected to the ID signal terminal 34.

A word is in order concerning the nature of the ID signal generator 20. There are several ways that it can be implemented. The simplest way, but nevertheless effective, is to use an astable multi-vibrator that produces a square wave, or perhaps a rectangular waveform. Instead of an astable multi-vibrator one could use a pseudo random bit sequence generator (PRBS), such as a tapped linear feedback shift register. The pseudo random sequence may also be generated in software running on the data measurement controller 35. That software may either emulate a PRBS, generate a pseudo random series of bits through numerical techniques (think: random binary number generator), or produce a pseudo random sequence of (say, decimal) numbers whose constituent bits are then taken as the desired pseudo random sequence of bits. The pseudo random sequence of bits may be either a fixed series of bits produced initially and then recirculated through a circular shift register, or may be a periodically changing pseudo random sequence of bits loaded into a shift register and then shifted out. As a precaution, the repetition rate of the astable multi-vibrator or the clock frequency of the shifted waveform could be adjusted so that it is not harmonically related to any clock frequency of interest in the D.U.T. 2. Operator selectable alternate clock frequencies and alternate uncommon patterns may be useful in dealing with occasional measurements plagued with "false positives", which would appear as recognition that either comes and goes or that appears when it is known that it should not.

The non harmonically related repetition rate or clock frequency may be chosen from a list of preselected values, or it may be specified directly, as for a digital synthesizer. Alternatively, a principal clock signal to be avoided in the D.U.T. could be probed and then applied to a phase locked loop that produces a different clock frequency that is shifted by a fixed amount, or that is shifted in a time variant manner. The clock signal that is shifted in frequency would be the non-harmonically related clock signal.

Figure 2:
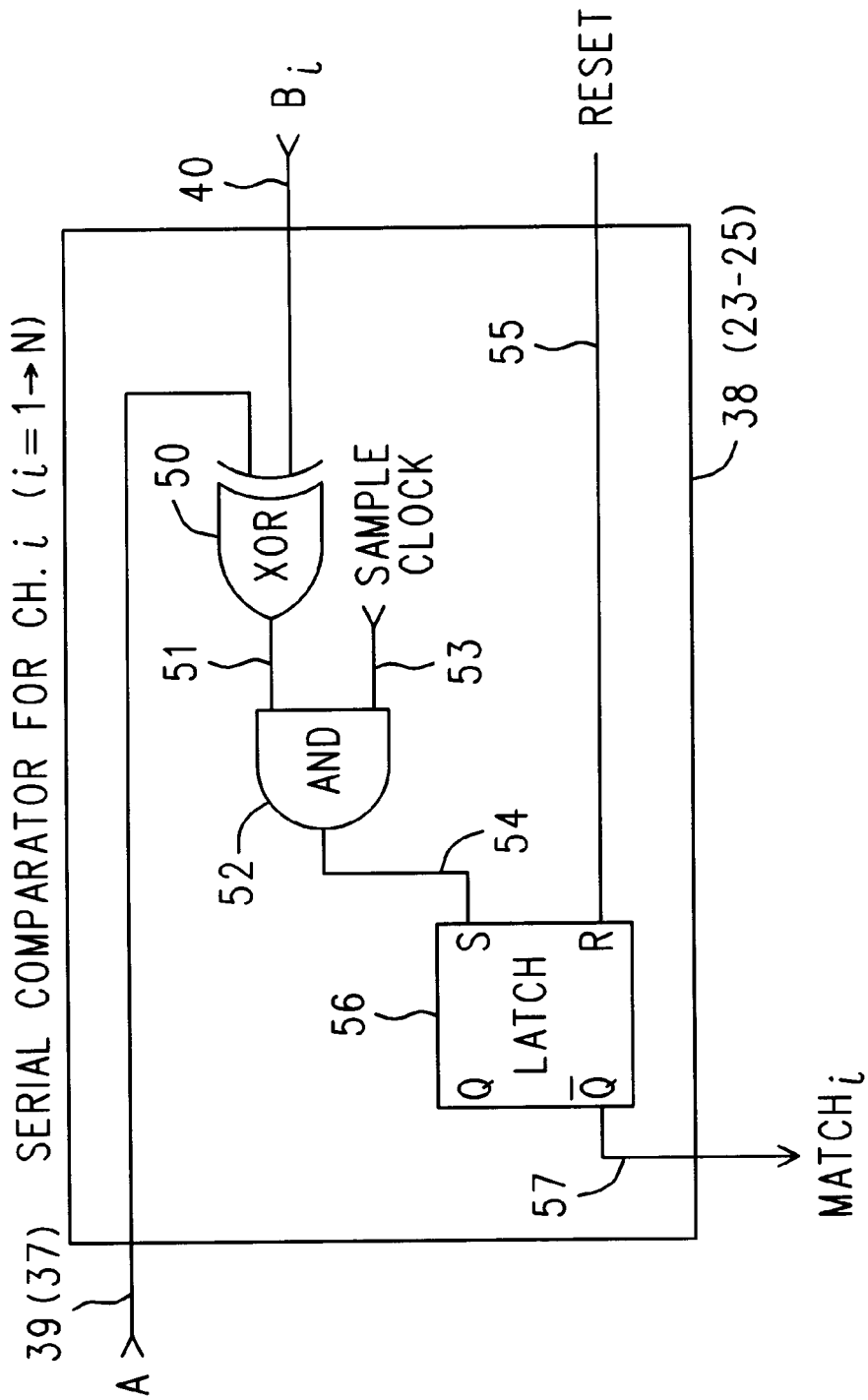
FIG. 2 is a simplified block diagram of a preferred way to implement the serial comparator circuit used in the block diagram of FIG. 1.

Refer now to FIG. 2, which is a simplified block diagram 38 of a preferred serial comparator (23–25) suitable for use in FIG. 1. At the beginning of a comparison period, a reset signal 55 resets, or clears, a latch 56. And although we have not shown any, it will readily be appreciated that there may need to be some "synchronization" or short term latching of the reset signal 55 if clock rates for the systems producing the reset signal 55, the A signal and the B signal are different or are unrelated. This is an implementation detail that cannot here be made more definite in the absence of the circuitry of a particular implementation.

The A signal 39 (conditioned ID signal 37 in FIG. 1) and the signal $B_i$ 40 (representing 26–28 in FIG. 1) are applied to an exclusive OR gate 50 whose output 51 is one input to an AND gate 52. The other input to AND gate 52 is a signal 53 called SAMPLE CLOCK, which controls, or at the very least is related to, the process by which values are obtained for the signals A and $B_i$. The idea here is that the exclusive OR gate 50 produces an output whenever signals A 39 and $B_i$ 40 differ in value. When the probe for the $i_{th}$ channel is on the ID signal terminal 34 there is presumably never any difference, although in a high speed system there may arise some skew that introduces glitches in the leading or trailing edges of the output 51 from the exclusive OR gate 50. To avoid those glitches is the reason for AND'ing that output 51 with the sample clock 53. In some systems such AND'ing might not be necessary if some sort of "low pass filter" (say, an integrator) were used to de-glitch output 51 and drive the Set input of latch 56.

Thus, the output 54 from the AND gate 52 is a bullet-proof version of the output of the exclusive OR gate 50. If the probe for the ith channel is on the ID signal terminal 34, then signal 54 will never go TRUE, not even as a glitch. Any difference between signal A 39 and $B_i$ 40 will cause signal 54 to go TRUE for at least some portion of the "true" phase of the signal sample clock 53, which is presumably a time when no difference is to be expected if the probe were on the ID signal terminal 34. Thus it is that the reset signal 29 can reset a latch 56, causing its NOT Q output 57 to go TRUE. This output 57 becomes the match signal for the $i$th channel ($MATCH_i$). Upon a reset signal 29 the matchi signal goes TRUE, but it will only stay TRUE as long as the signals A 39 and $B_i$ 40 remain in subsequent agreement; the first instance of a difference will cause signal 54 to go TRUE, which then sets the latch 56, and causes NOT Q 57 to go FALSE.

Figure 3:
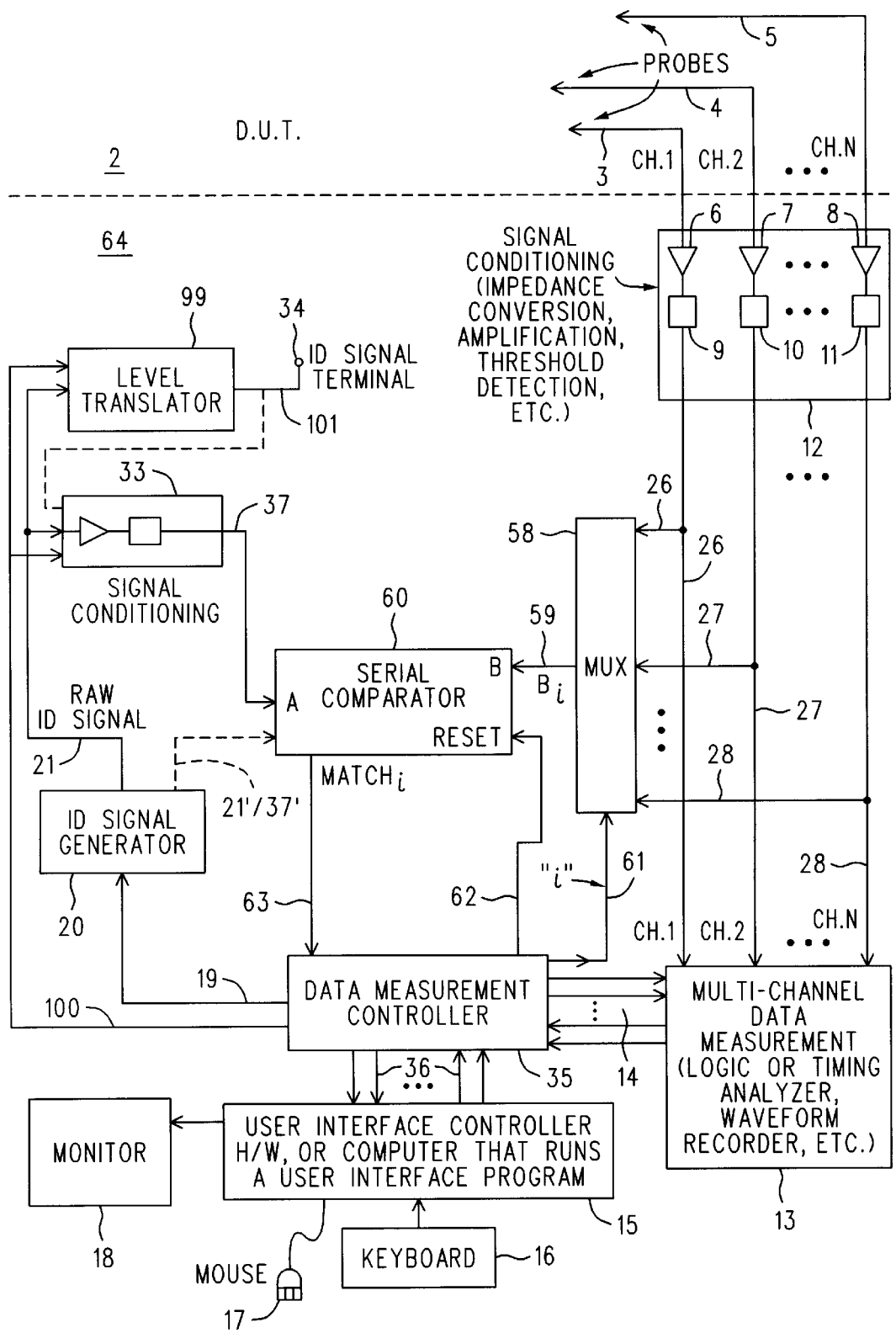
FIG. 3 is a simplified block diagram similar to FIG. 1, except that it has been arranged to use only a single serial comparator.

Now refer to FIG. 3, which is a simplified block diagram 64 similar to the block diagram 1 of FIG. 1, and note that only one serial comparator 60 need be present. (Once again, temporarily assume that only one logic family of levels is in use.) This reduction in the number of serial comparators is achieved by placing a MUX 58 between the serial comparator 60 and the various conditioned channel signals 26–28. A line or lines 61 from the data measurement controller 35 tells the MUX 58 which of the various conditioned channel signals to pass through to become signal $B_i$ 59. Signal 59 is the "B" input to the single serial comparator 60; the "A" input is obtained as before. In operation, a value for i is selected and the serial comparator 60 is reset by reset signal 62. Then, at the end of a selected period of time the $match_i$ signal is checked to see if the probe for the $i_{th}$ channel is on the ID signal terminal 34. An accompanying difference between the block diagram 64 of FIG. 3 and the block diagram 1 of FIG. 1 is that only the single signal $match_i$ 63 need be checked in block diagram 64, whereas they each (30–32) must be scanned for block diagram 1. It follows that block diagram 1 may identify that a probe is on the ID signal terminal 34 somewhat faster than block diagram 64 does, although in terms of human perception the difference is probably insignificant.

It will be appreciated that a hybrid version exists that includes a MUX 58 and a plurality of serial comparators 32–25. This arrangement affords an excellent compromise between speed of operation and amount of hardware, and can assist when more than one logic family level is in use. Say, there were both ECL and TTL levels in use, and there were two serial comparators both connected to the output of the MUX. One of the serial comparators (and its associated signal conditioner 33) would operate at ECL levels while the other operates at TTL levels. This saves time by overlapping both kinds of tests; otherwise a single resource would have to be used twice in succession, once at ECL levels and then again at TIL levels.

Refer now to FIG. 4, which is a simplified flow diagram 65 describing a portion of the operation of the block diagram 1 of FIG. 1 as it pertains to channel identification. The programming represented by the flow chart resides in the data measurement controller 35 and is either executed periodically (say, ten times a second), or is executed in response to a command issued by the operator. It will be understood that the flowchart 65 will be executed once for each logic level known or thought possibly to be in use. In any event, the first step 66 in the flow chart is to issue the reset signal 29. This readies the serial comparators 23–25. The next step 67 is to start the ID signal generator 20, if it is not already running; if the ID signal generator 20 runs all the time, then step 67 would be absent. The next step 68 is to wait the prescribed amount of time for the serial comparisons to occur. Then at step 69 the value of a local variable i is set to one, after which step 70 asks if the signal $MATCH_i$ is true. If it is it means that the probe for channel i is on the ID signal terminal 34. In that case what to do next is represented by step 71: indicate channel identity. This may include displaying a message on the monitor 18 to the effect that the probe for channel i has just been identified as being connected to the ID signal terminal. The message may also include what parameter choices have already been selected or defined for that channel. Such a message might remain visible until it is acknowledged by the user (he clicks on "OK" in a dialog box), or it might remain visible only for as long as the probe is connected to the ID signal terminal 34. The channel identification need not be displayed on a monitor; it could also be accomplished by illuminating suitable lamps or LED's on a panel. After step 71 the process continues with step 81 to find any other probes that might be connected to the ID terminal 34. Alternatively, following step 71 could be the optional step 74, where the ID signal generator is turned off.

The difference between these two alternatives is whether or not to allow more than one probe on the ID terminal at one time. If simple probe identification is the goal, then it probably is not productive to allow it. However, if indicating channel parameters is included, then it probably does. Consider the following scenario. The operator and his assistant were experimenting before lunch, and now after lunch they cannot remember how things were left. The question in their minds is "Did we leave one of those four probes set to TTL or did we switch them all back to CMOS?" They can find out by putting them all onto the ID signal terminal, either one at a time, or, all at once.

If the answer to the inquiry at step 70 is "NO", then step 72 asks if all the channels have been checked. If not, then step 73 increments i to represent the next channel; if so, then the optional step 74 (present or absent as is step 67) turns off the ID signal generator, after which this instance of the channel identification process is complete.

FIG. 5 is a simplified flow chart 75 describing the channel identification portion of the operation of the operation of block diagram 64 of FIG. 3. It is similar to the flow chart 65 of FIG. 4, except that since there is only one serial comparator 60 to which only one channel is output from the MUX 58 at any given time, each change in the value of the loop variable i (steps 77 and 82) must be followed by an instance (78) of the reset signal 62 in order to restart the serial comparison process. Given the nature of typical programmable controllers, it is probable that the value of the loop variable i is not automatically nor continuously present outside that controller, unless it is sent out. This accounts for the added step 98, where signal 61 to the MUX 58 is made to correspond with the value of that loop variable i. With those observations, the flow chart 75 is believed to speak for itself.

Figure 6:
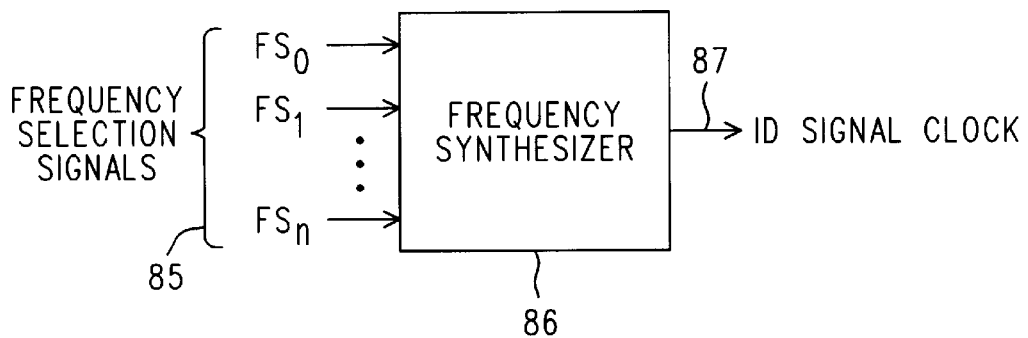
FIG. 6 is a an example simplified partial block diagram of a portion of the ID signal generator of FIGS. 1 and 3 that produces an ID signal clock different from a clock frequency of interest.

Finally, we turn to the nature of the ID signal generator 20, as illustrated in simplified general form by FIGS. 6–10. Referring briefly now to FIG. 6, recall the earlier mention that it may be desirable if the clock rate of the ID signal were different from a clock rate of interest in the D.U.T. 2, especially if the ID signal has a simple periodic waveform. According to FIG. 6, a frequency synthesizer 86 may be responsive to various frequency selection signals 85 to produce an ID signal clock signal 87 of a desired frequency. The techniques of frequency synthesis are well known, and need not be described here. The frequency selection signals originate with the data measurement controller 35 in response to instructions concerning ID signal clock frequency received from the operator by the user interface controller 15. The ID signal clock 87 is used as a clock signal in the production of the ID signal 21.

Figure 7:
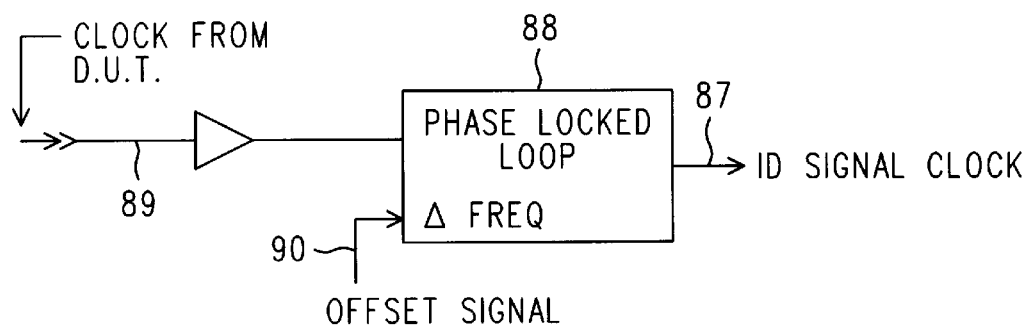
FIG. 7 is a an alternate simplified partial block diagram of a portion of the ID signal generator of FIGS. 1 and 3 that produces an ID signal clock different from a clock frequency of interest.

FIG. 7 shows another way of producing an ID signal clock 87 having a frequency different from a clock signal 89 of interest in the D.U.T. 2. In this instance the clock signal of interest is applied to a phase locked loop 88 which also receives an offset signal. The result is that the frequency of ID signal clock 87 differs from the frequency of clock signal 89 by a selected amount, which amount might also be time variant. Such phase locked loop frequency shifting is well known in the art.

Figure 8:
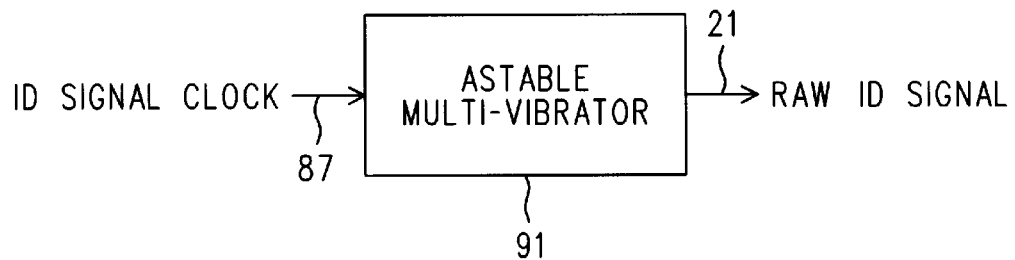
FIG. 8 is a an example simplified partial block diagram of a portion of the ID signal generator of FIGS. 1 and 3 that produces an ID signal.

FIG. 8 shows that the ID signal 21 can be produced as simply as driving an astable multi-vibrator 91 with the ID signal clock 87. In such a simple case it is probably desirable that the ID signal clock not be of the same frequency as some principal clock in the D.U.T. 2.

However, if more complex resources are available, and a long period pseudo random sequence of bits can be generated, then it is of less concern that the ID signal clock 87 actually be of a frequency different from that for a principal clock signal in the D.U.T. 2. After all, that is the power of the random part of the term "pseudo random". Thus, it will be understood and appreciated that in connection with FIGS. 9 and 10 the ID clock signal 87/97 may have the shifted frequency attributed to 87, or may simply have either the frequency of clock signal 89 (say, by connecting to it) or might be some favorite standard frequency. These last two cases are what is indicated by the reference numeral 97.

Figure 9:
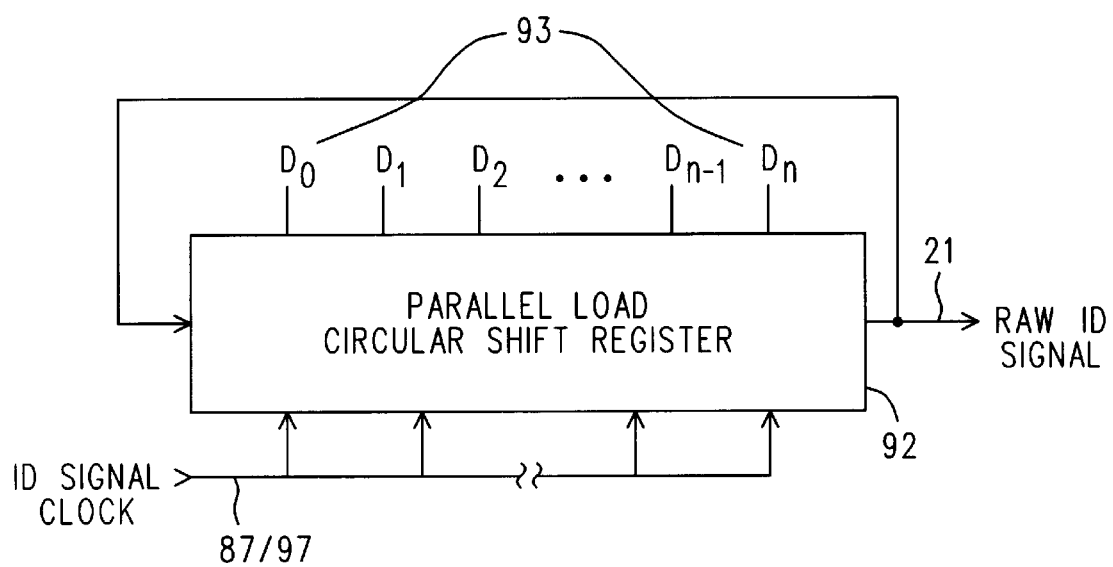
FIG. 9 is a an alternate simplified partial block diagram of a portion of the ID signal generator of FIGS. 1 and 3 that produces an ID signal.

Accordingly, refer now to FIG. 9, which is a circular shift register 92 that can be parallel loaded with a pseudo random sequence of bits 93 ($D_0$–$D_n$) originating with the data measurement controller 35. Once the circular shift register 92 is loaded it is simply shifted at the rate indicated by ID clock signal 87/97, and the output of one of the stages is taken as the ID signal 21.

Figure 10:
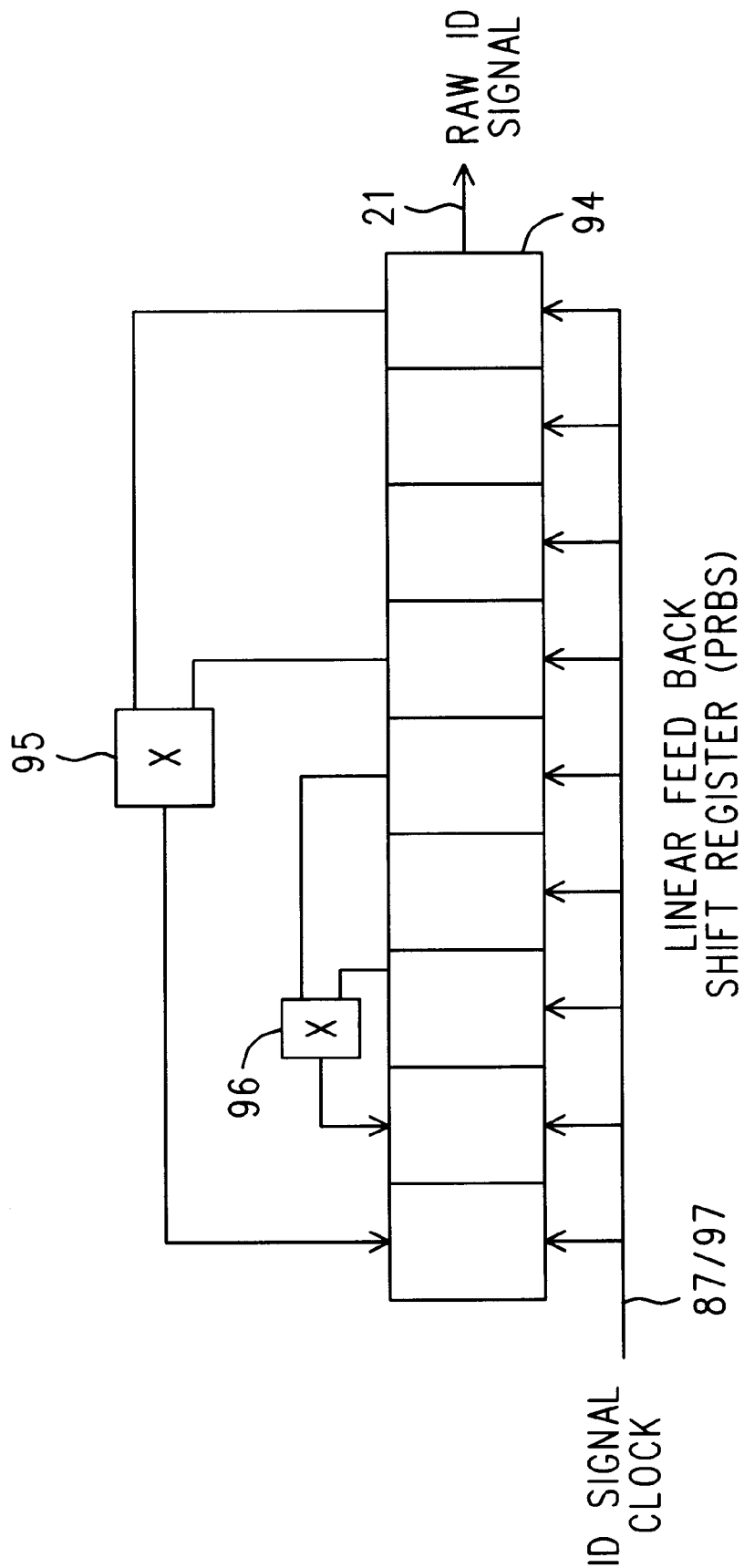
FIG. 10 is a yet another alternate simplified partial block diagram of a portion of the ID signal generator of FIGS. 1 and 3 that produces an ID signal.

Lastly, refer now to FIG. 10, which is a simplified and generalized block diagram of a linear feedback shift register 94 operated as a Pseudo Random Bit Sequencer (PRBS). Linear feedback shift registers and PRBS are well understood items, and need not be described here. We will simply point out that the shift register 94 incorporates some "feedback" 95 and 96 that perturbs the otherwise simple progression of bits as they are shifted along the register. PRBS can have very long sequences before they repeat, and they can be built to meet various statistical requirements as to the distribution of 1's and 0's in the resulting pattern.

I claim:

1. Probe to channel correspondence apparatus in an instance of multi-channel electronic test equipment, the apparatus comprising:

a plurality of measurement channels, each measurement channel having an input and an output;

a plurality of probes, each probe of the plurality having a first end connected to the input of an associated measurement channel and a second end deployable for measuring an associated work signal in a device under test;

an identification signal generator that produces an identification signal that is as measurable as any work signal except that it is unlikely to be identical to an actual work signal to be measured in a device under test;

an identification terminal coupled to the identification signal and physically accessible by second of probes within the plurality thereof;

a plurality of signal comparison circuits each having first and second comparison inputs and comparison output, the comparison output indicative of whether or not a signal applied to the first comparison input matches one applied to the second comparison input, each signal comparison circuit corresponding to an associated measurement channel, each first comparison input coupled to the identification signal and each second comparison input coupled to the output of a respective corresponding measurement channel;

a corresondence circuit coupled to each of the comparison outputs and producing an output identifying a measurement channel having a probe whose second end is electrically connected to the identification terminal;

multi-channel measurement circuitry coupled to the outputs of the plurality of measurement channels and producing measurements based on the behavior of work signals to which probes in the plurality of probes have been connected; and a display coupled to the multi-channel measurement circuitry and to the correspondence circuit, the display indicating results of multi-channel measurements upon work signals and indicating a channel identifier for a probe whose second end is electrically connected to the identification terminal.

2. The apparatus as in claim 1 wherein the identification signal generator comprises an astable multivibrator.

3. The apparatus as in claim 1 wherein the identification signal generator comprises a pseudo random sequence generator.

4. The apparatus as in claim 1 wherein the identification signal generator produces the identification signal in response to the presence of a control signal.

5. Probe to channel correspondence apparatus in an instance of multi-channel electronic test equipment, the apparatus comprising:

a plurality of measurement channels, each measurement channel having an input and an output;

a plurality of probes, each probe of the plurality having a first end connected to the input of an associated measurement channel and a second end deployable for measuring an associated work signal in a device under test;

an identification signal generator that produces an identification signal that is as measurable as any work signal except that is unlikely to be identical to an actual work signal to be measured in a device under test;

an identification terminal coupled to the identification signal and physically accessible by second ends of probes within the plurality thereof;

a multiplex circuit coupled to each measurement channel output and that periodically couples each measurement channel output to a MUX output of the multiplex circuit, the multiplex circuit also having a channel indication signal output whose value indicates which measurement channel among the plurality thereof appears at the MUX output;

a signal comparison circuit having first and second comparison inputs and a comparison output, the comparison output indicative of whether or not a signal applied to the first comparison input matches one applied to the second comparison input, the first comparison input coupled to the identification signal and the second comparison input coupled to the MUX output of the multiplex circuit;

a correspondence circuit coupled to the comparision output and to the channel indication signal of the multiplex circuit, the correspondence circuit producing an output identifying a measurement channel having a probe whose second end is electrically connected to the terminal;

multi-channel measurement circuitry coupled to the outputs of the plurality of measurement channels and producing measurements based on the behavior of work signals to which probes in the plurality of probes have been connected; and a display coupled to the multi-channel measurement circuitry and to the correspondence circuit, the dispaly indicating results of multi-channel measurements upon work signals and indicating a channel identifier for a probe whose second end is electrically connected to the identification terminal.

6. A method of identifying the channel associated with one of a plurality of probes for multi-channel electronic test equipment, the method comprising the steps of:

(a) generating an identification signal measurable by the test equipment and comparable to permissible work signals except that is unlikely to be identical to a work signal to be measured in a device under test;

(b) connecting to a terminal at which the identification signal is present a probe whose associated channel is to be identified;

(c) comparing the signal present on each channel with the identification signal; and (d) indicating which, if any, channels have a signal present that is the same as the identification signal.

7. A method as in claim 6 wherein the comparing step (a) further comprises the step of randomizing the identification signal.

8. A method as in claim 6 wherein the comparing step (c) is performed for selected durations of time that are repeated periodically.

* * * * *